United States Patent [19]

Palatov

[11] Patent Number: 5,740,020
[45] Date of Patent: Apr. 14, 1998

[54] COMPUTER HOUSING AND EXPANSION CARD FORMAT FOR CONSUMER ELECTRONICS DEVICES

[76] Inventor: Dennis Palatov, 36 Nightingale Dr., Aliso Viejo, Calif. 92656

[21] Appl. No.: 791,472

[22] Filed: Jan. 27, 1997

Related U.S. Application Data

[62] Division of Ser. No. 605,278, Feb. 7, 1996.

[51] Int. Cl.⁶ .................... H05K 7/14; H01R 23/68
[52] U.S. Cl. .................. 361/796; 361/785; 361/788; 361/803; 361/736; 439/59; 439/60; 439/346
[58] Field of Search .................. 361/728, 736, 361/741, 752, 756, 785, 788, 796, 800, 802, 803, 725, 727; 439/607–610, 60, 59, 61, 64, 65, 346, 374, 377, 345, 621

[56] References Cited

U.S. PATENT DOCUMENTS

| 4,692,120 | 9/1987 | Feinstein | 439/62 |
| 4,744,006 | 5/1988 | Duffield | 361/686 |

*Primary Examiner*—Kristine L. Kincaid
*Assistant Examiner*—Anthony Dinkins
*Attorney, Agent, or Firm*—Curtis L. Harrington

[57] ABSTRACT

A computer housing and expansion card design facilitates the addition and removal of expansion cards from the front of a computer housing without disassembly of the housing, and further facilitates the connection of external cables to the expansion cards from the back of the computer housing.

7 Claims, 8 Drawing Sheets

COMPUTER HOUSING AND EXPANSION CARD FORMAT FOR CONSUMER ELECTRONICS DEVICES

This is a division of U.S. patent application Ser. No. 08/605,278 filed Feb. 7, 1996.

FIELD OF THE INVENTION

The present invention relates to the field of computer enclosure design. Specifically, the present invention relates to a computer enclosure design and a complementary expansion card design to allow the addition and removal of expansion cards from the enclosure by an untrained user without requiring any disassembly of the enclosure.

BACKGROUND OF THE INVENTION

Computing devices, such as Personal Computers, are now commonplace in the consumer market. Unfortunately, the current state of the art in enclosure and expansion card design requires considerable expertise and time on the part of the user to change or upgrade the functionality of such devices. Although some designs allow for the upgrade procedure to be accomplished using common household tools, and even without tools, invariably they all require at least partial disassembly of the housing.

In the industrial and telecommunications markets, computer enclosures of rack-mount type are used. Rack-mount enclosures typically consist of a five-sided box with the front vertical face open to accept expansion cards. A backplane having a number of sockets is usually installed in the back of the unit, parallel to the back vertical wall. Expansion cards are installed from the front, guided by rails or similar mechanisms, and engage sockets on the backplane when fully seated. All connections for external cables are placed at the front of the unit, on the front bezel of each expansion card. Disk drives with removable media, such as floppy drives, are often placed directly onto expansion cards providing direct access to the media and eliminating the need for cables. The designs using rack-mount enclosures include industry-standard computers based on busses such as VME and others, and provide excellent accessibility to expansion cards without requiring enclosure disassembly. Unfortunately, the fact that all external cables attach to expansion cards from the front of the enclosure renders the rack-mount enclosure type unacceptable for the office and home microcomputer market, both from cosmetic, ergonomic and safety standpoints.

One of the driving requirements for the desktop computer market is that of the ability to attach additional external cables to the back of the computer enclosure. This places such cables out of sight, reduces desktop clutter, and prevents accidental disconnection by the user. All the solutions currently available in the office and home microcomputer markets, including those based on industry-standard busses such as ISA, PCI, NuBus and Micro Channel, approach this problem in essentially the same manner. The typical microcomputer enclosure is a six-sided box constructed of at least two major parts, a chassis and a cosmetic cover. The back vertical wall of the chassis features openings through which connectors on expansion cards may be accessed. A backplane or a motherboard is installed in the chassis perpendicular to the back vertical wall and features a plurality of sockets for accepting expansion cards. The expansion cards of prior art typically comprise a bus connector located along one edge of the card and optional electrical connectors for the attachment of external cables located along an adjacent, perpendicular edge of the card. A metal bezel is typically utilized on expansion cards to block the portion of the opening in the back vertical wall of the chassis that is not utilized for accessing electrical connectors on the card. When a card having electrical connectors is installed in a socket on the backplane, the electrical connectors on the card can then be accessed through an opening in the back vertical wall of the chassis.

The process of installing expansion cards involves four major steps. First, the cosmetic cover is removed from the chassis. Second, an opening in the back vertical wall of the chassis is exposed by removing a metal bracket or cover plate. Third, an expansion card is installed perpendicular to both the backplane and the back vertical wall of the chassis by inserting said card into an appropriate socket on the backplane so that the bezel of the expansion card aligns with the opening in the back vertical wall exposed in step two. Step four involves the installation of the cosmetic cover back onto the chassis.

The typical microcomputer enclosure is further complicated by the fact that disk drives with removable media are best accessed from the front of the enclosure. To facilitate such access, the majority of microcomputer enclosures incorporate separate drive bays at the front of the unit. The placement of the drive bays at the front of the enclosure requires the use of cables to provide electrical connections between the drive and the drive controller card. A disk drive is installed in a typical microcomputer chassis, with or without special adapter brackets, in a five-step process. Step one involves the removal of the cosmetic cover from the chassis. In step two, a blank bezel is removed from the cosmetic cover to allow subsequent access to the disk drive. The third step consists of the installation of the disk drive in a drive bay. Extra steps may be required at this point to install a drive controller card in an expansion slot, if one is not already present. Then, in step four, the necessary cables are connected between the drive and the drive controller card, and also the power supply. In step five the cosmetic cover is installed back on the chassis.

As can be seen from the above description, the microcomputer chassis designs of the prior art achieve the placement of external cable connections on the back of the enclosure at the expense of significant complexity in terms of both design and serviceability.

Due to the rapidly changing nature of the computer market, the ability to easily upgrade the functionality of computing devices is essential in maintaining their usefulness. As more and more computing devices find their way into the homes of consumers who lack technical training, the ease with which these devices can be upgraded becomes a major factor in determining their useful life.

In addition to the difficulties in upgrading and service, the design complexity of existing microcomputer enclosures results in considerable expense to the manufacturer in terms of raw materials, tooling, and manufacturing cost, diminishing the manufacturer's overall ability to compete in the marketplace.

What is needed is a new design to allow computing devices that can be upgraded easily in the field by untrained consumers and that can be manufactured efficiently with the minimum number of parts and assembly steps. The present invention possesses several new and unique features to enable it to meet these goals.

SUMMARY OF THE INVENTION

The main objective of the present invention is to provide a computer enclosure and expansion card design which facilitates the installation and removal of expansion cards from the front of the enclosure without disassembly of said enclosure, and also allows the attachment of external cables to installed expansion cards from the back of the enclosure. A computer enclosure apparatus and a complementary expansion card design are disclosed herein that achieve this objective. Within the context of the invention, the term 'computer' means any electronic device for processing digitally encoded information.

The computer enclosure has a back wall having a plurality of openings, equal in number to the maximum number of expansion cards the enclosure is designed to receive, and also has a backplane with a plurality of sockets to accept expansion cards. The sockets are equal in number to the openings and are spaced the same distance apart as the openings. The backplane is mounted in the enclosure parallel to the back wall, and is sized and aligned so as not to block any of the openings, and so that each of said plurality of sockets is juxtaposed to and substantially aligned with exactly one of the openings. The computer enclosure of the present invention is configured to receive expansion cards for installation from the front of the enclosure. The enclosure may additionally incorporate structure for slidingly receiving the expansion cards, as well as latching structure to facilitate installation, positive retention and removal of the expansion cards.

The expansion card of the present invention includes a printed circuit board, a bus connector positioned along the back edge of the expansion card to engage one of the sockets on the backplane, and a connector for the attachment of external cables to the expansion card. The connector is positioned along the same (back) edge of the expansion card as the bus connector, and aligned so as to be accessible from the back of the enclosure through the appropriate opening in the enclosure back wall when the expansion card is installed in a socket on the backplane of the computer enclosure. Optional indicator lights, switches and removable media receptacles are positioned along the opposite (front) edge of the expansion card so as to be accessible from the front of the enclosure. An expansion card assembly is possible utilizing a small-size printed circuit board mounted on a metal frame, said frame sized and proportioned so as to facilitate installation in the computer enclosure of the present invention, and the printed circuit board mounted on the frame so as to align with a socket on the backplane and an opening in the enclosure back wall when the expansion card assembly is installed in the enclosure.

BRIEF DESCRIPTION OF THE DRAWINGS

The invention, its configuration, construction, and operation will be best further described in the following detailed description, taken in conjunction with the accompanying drawings in which.

DETAILED DESCRIPTION OF THE PREFERRED EMBODIMENT

The preferred embodiment of the present invention is a low-cost upgradeable home computer. A computing device intended for the consumer market places an equally high premium on cosmetic appearance, ease of use and low cost, and therefore stands to derive the most benefit from the innovations of the present invention.

Figure 1:
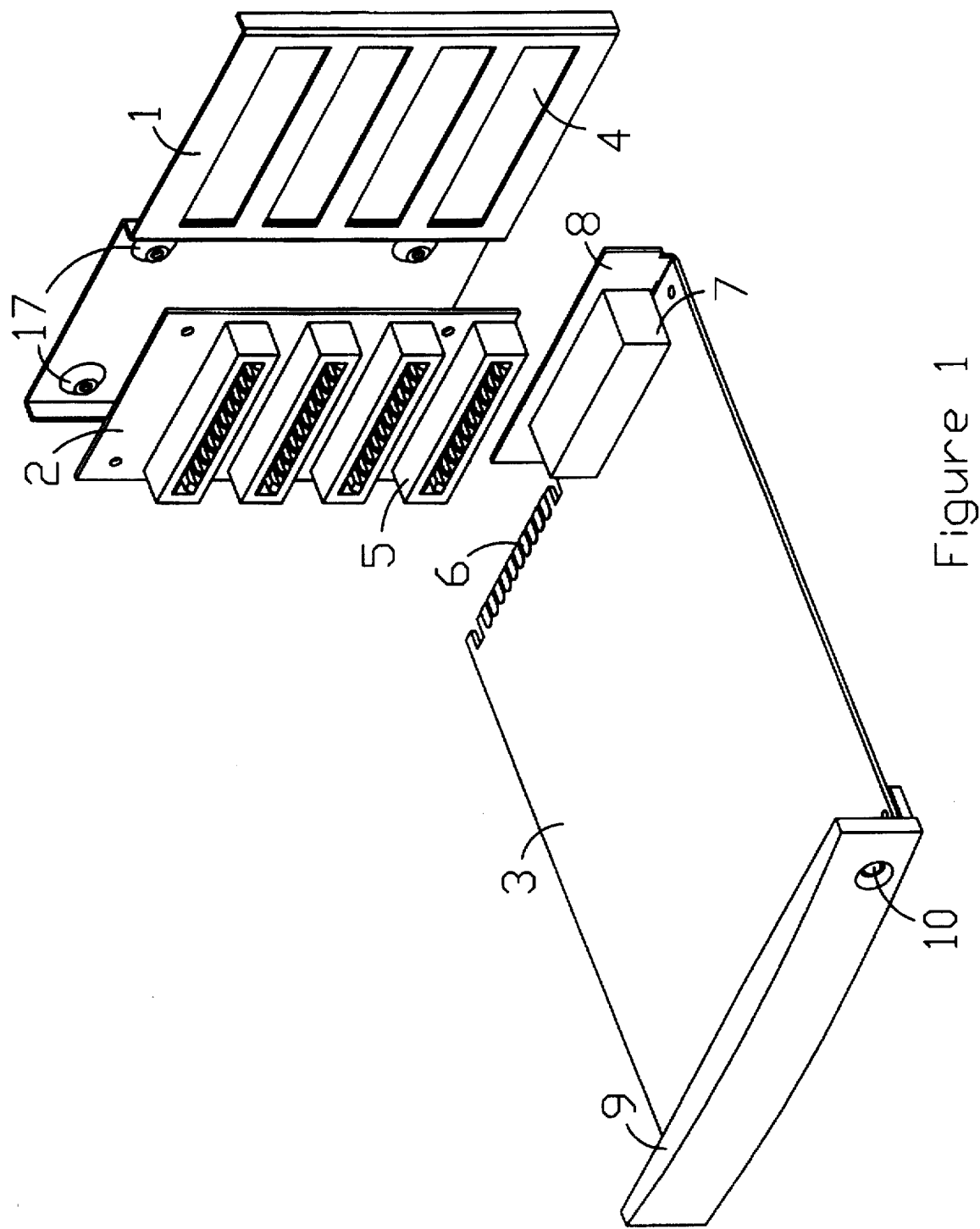
FIG. 1 is an exploded perspective view showing the enclosure back wall of the invention having a plurality of openings, the backplane of the invention having a plurality of sockets and an expansion card interconnectable therewith.
Figure 2:
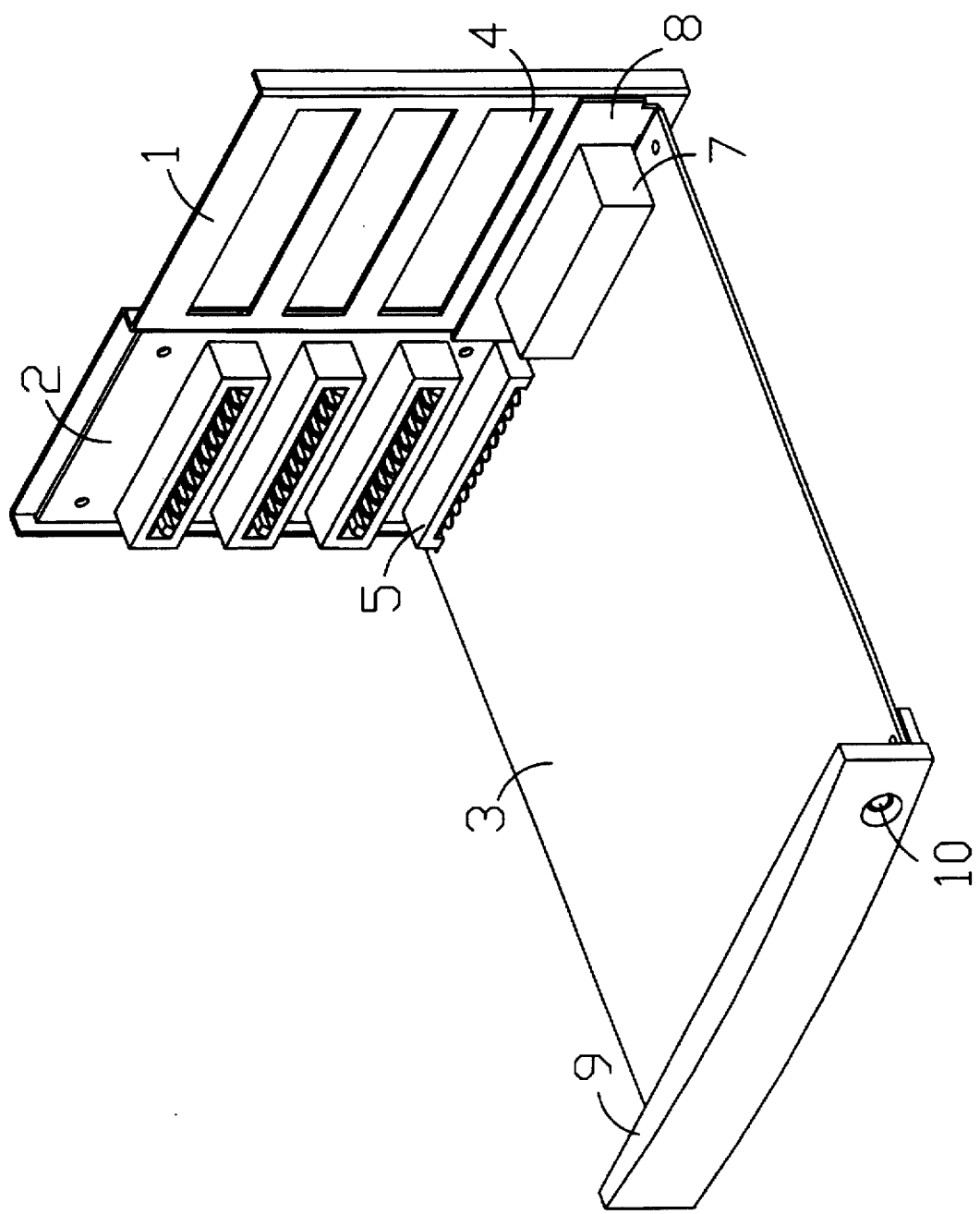
FIG. 2 shows the components of FIG. 1 assembled together in accordance with the present invention.
Figure 3:
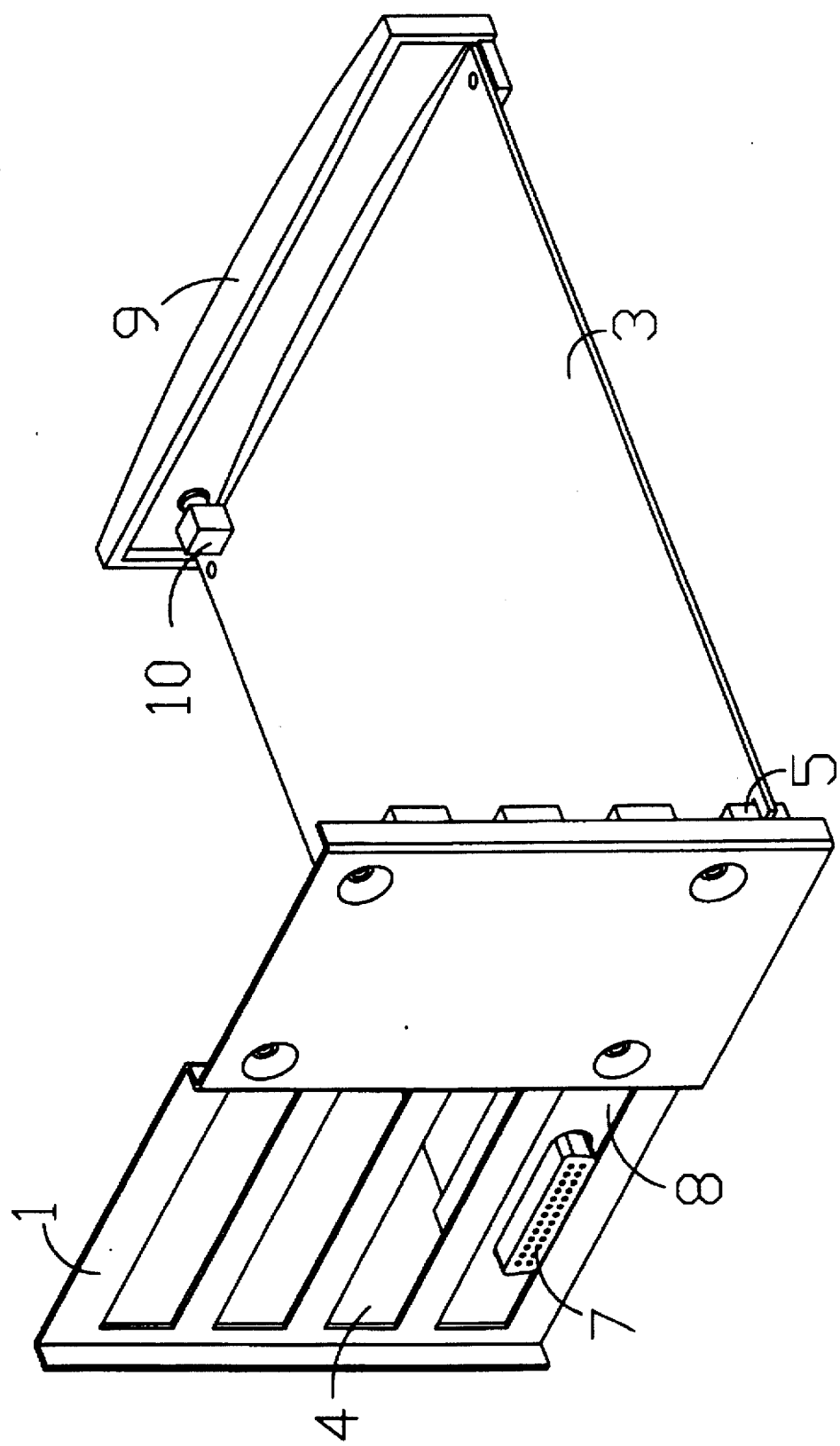
FIG. 3 is a perspective view showing the assembly in FIG. 2 from the back.

The essential components of the invention are illustrated in FIG. 1. An enclosure back wall 1 is an important part of a complete enclosure, which in the preferred embodiment is a five-sided box with the front face open in order to receive expansion cards. The specific features of enclosure back wall 1 that are particular to the present invention are a set of openings 4 that will allow access from the outside to installed expansion cards on the inside. In addition, the back wall 1 will allow the mounting of a backplane 2 parallel to the enclosure back wall 1. Other means of mounting the backplane 2 parallel to the back wall 1 are possible that are not part of the enclosure back wall 1 but are instead incorporated into other parts of the computer enclosure. A number of computer enclosure designs are known in the prior art that feature access openings in the enclosure back wall, however the backplane or motherboard in these designs is mounted perpendicular to the enclosure back wall. By specifying that the backplane 2 is mounted parallel to the enclosure back wall 1 the teachings of the present invention enable the key benefits of being able to install and remove expansion cards from the front of the enclosure and being able to attach external cables to expansion cards from the back of the enclosure.

The main supporting structure is a printed circuit board 3. This is a horizontal member which will support electronics of the device which is being installed. Note that the backplane 2 has a plurality of sockets 5 which will connect with a bus connector 6 located on the printed circuit board 3. Bus connector 6 shown is of the card-edge type. Bus connector 6 may be of the right-angle box type, in addition to a surface-mount type, in addition to any of a number of known types. Adjacent the bus connector 6 is a connector 7 intended to facilitate connection between the printed circuit board 3 and its associated electronics and points remote with respect to the present invention. A metal back bezel 8 surrounds the connector 7 and accomplishes several functions. The bezel 8 provides support and stability to the connector 7. The bezel 8 further provides a sealing and finishing structure with respect to the plurality of openings 4. This will help where the enclosure of the present invention is being cooled under directed air flow, and also for the prevention of dust from entering and coming into contact with the electronics carried on the printed circuit board 3.

At the other end of the printed circuit board 3, a front bezel 9 is supported, and shown with an indicator light 10. It is understood that the indicator light 10 may exist in multiple numbers depending upon the electronics carried by the printed circuit board 3, as are necessary to indicate functionality to the user.

Figure 4:
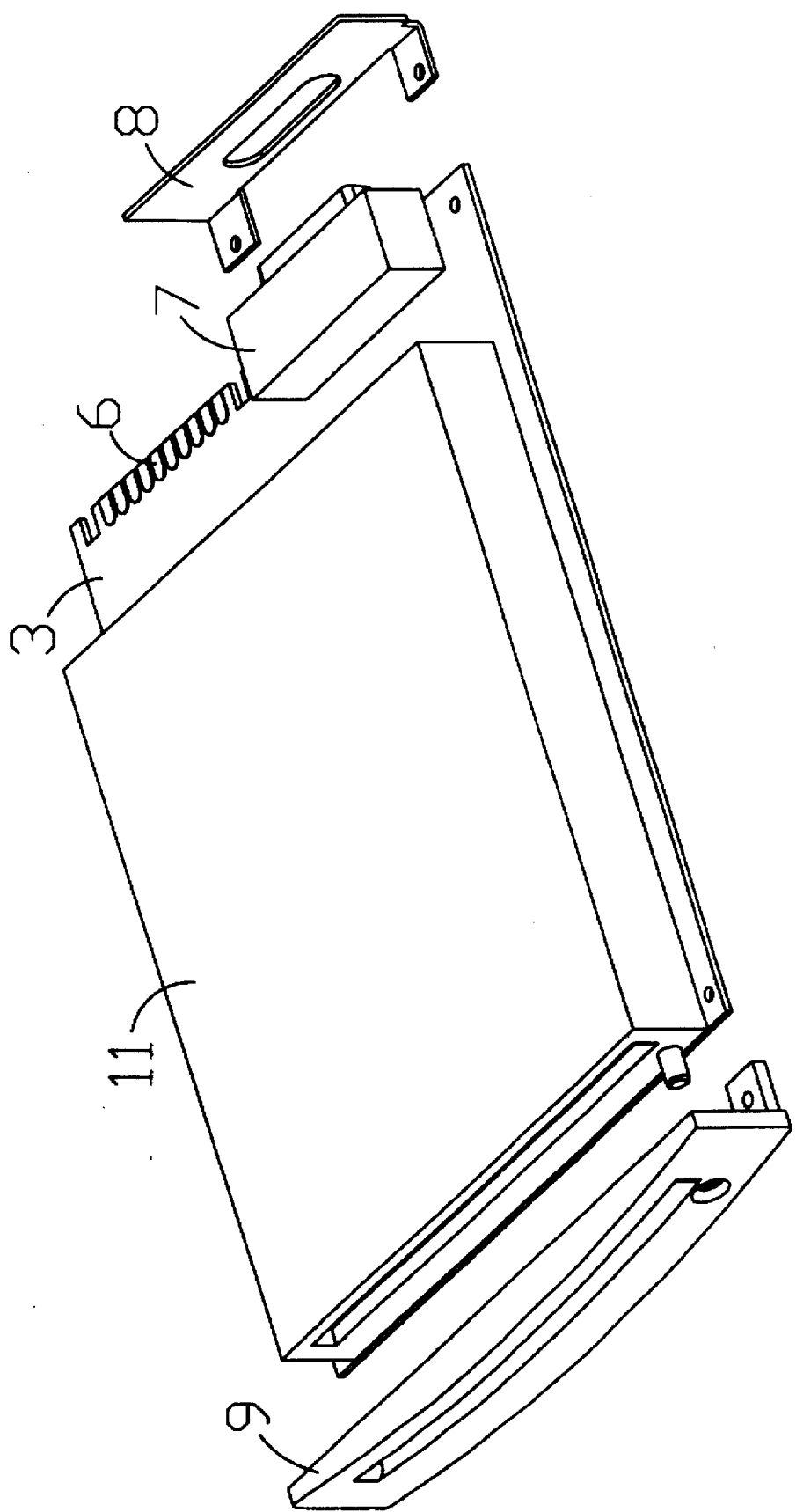
FIG. 4 is an exploded perspective view of an expansion card shown in FIGS. 1-3.

The expansion card illustrated in FIG. 1 is one of many designs that may be constructed in accordance with the present invention. Additional examples of such designs are shown in FIG. 4, FIG. 5, FIG. 6 and FIG. 7. In FIG. 4, an exploded view of a CD-ROM expansion card is shown. A CD-ROM drive 11 is shown mounted directly onto the printed circuit board 3.

Figure 5:
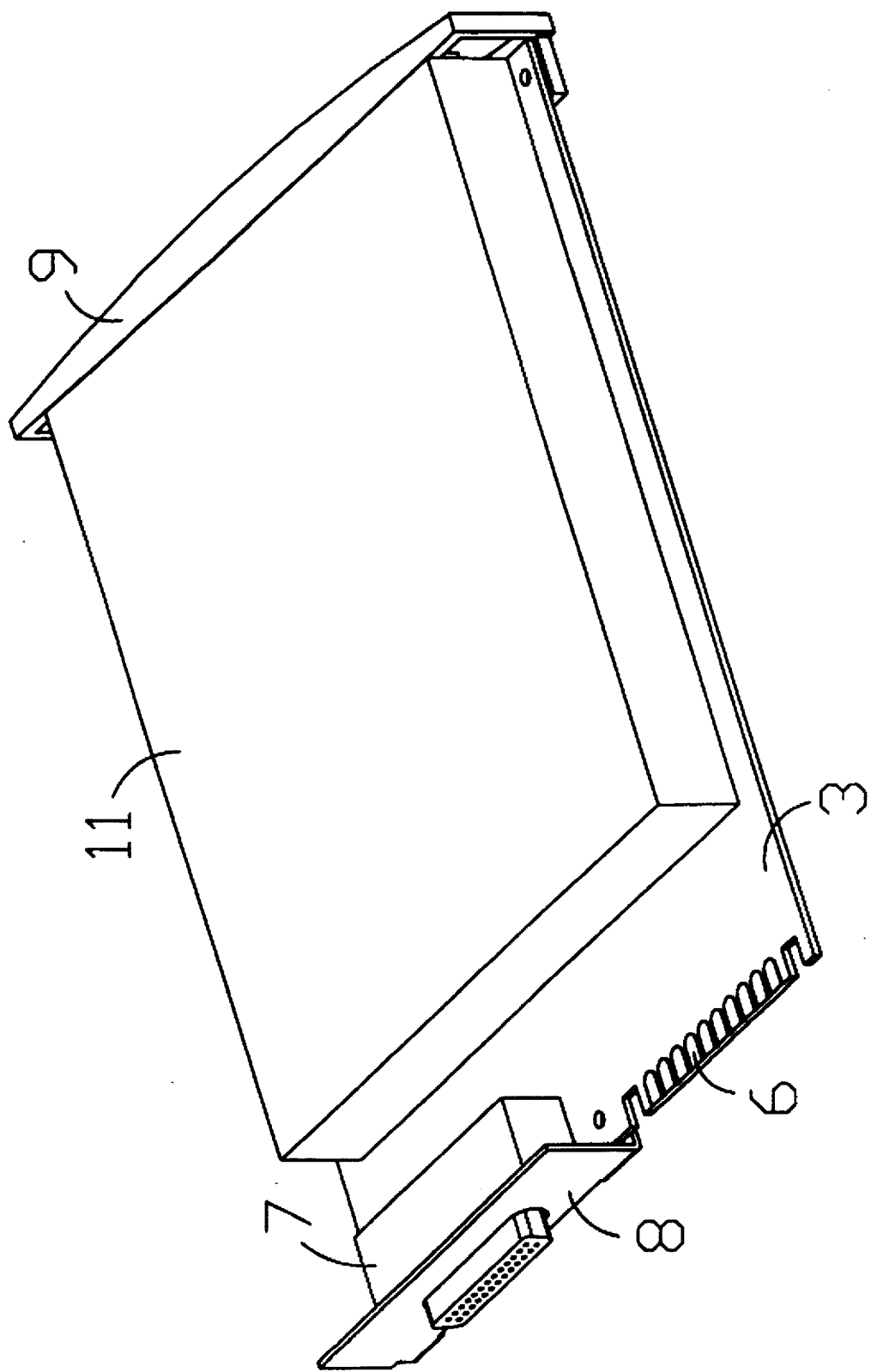
FIG. 5 shows the assembled expansion card of FIG. 4 from a back perspective view.
Figure 6:
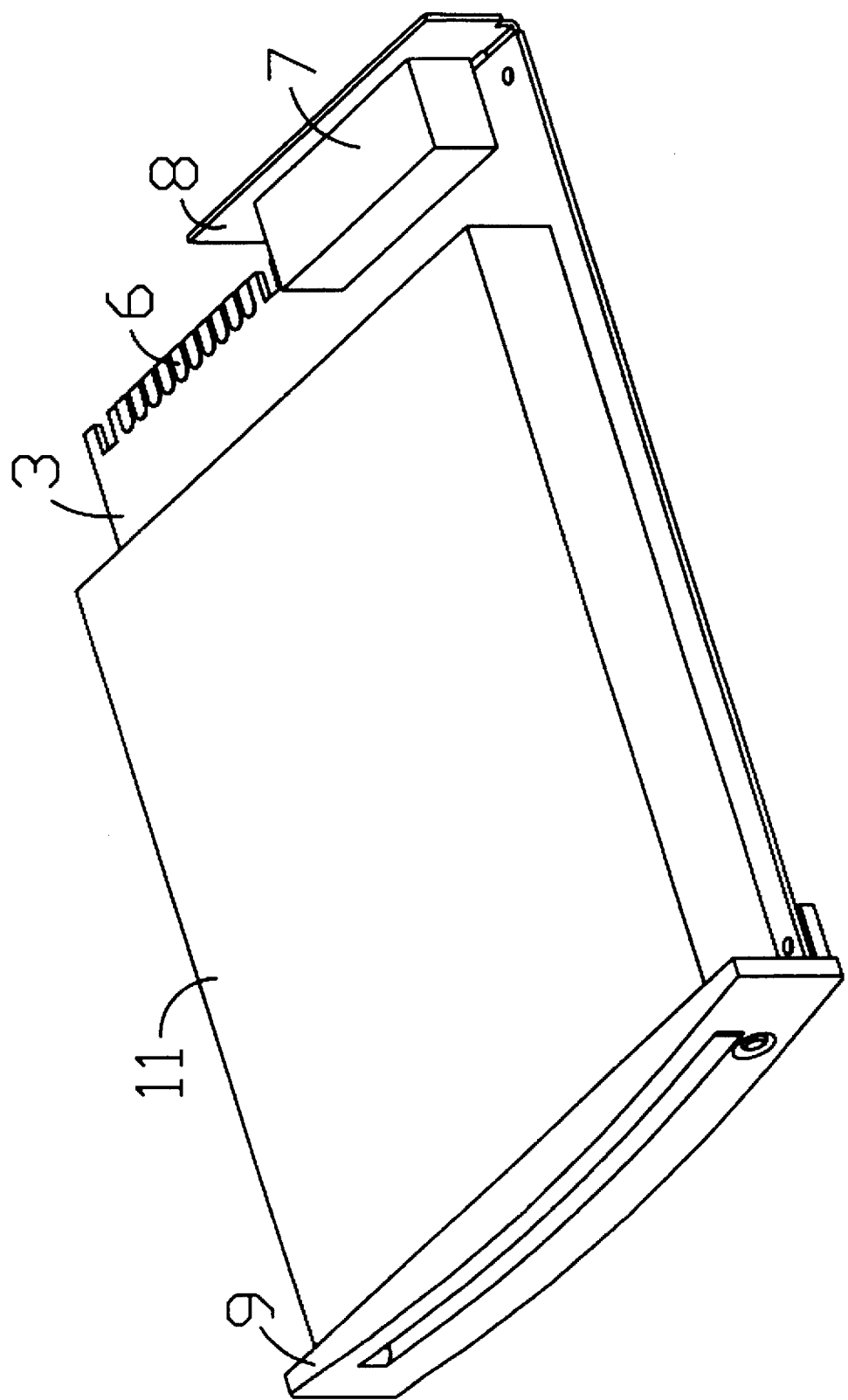
FIG. 6 is a front perspective view of the assembly in FIG. 5.
Figure 7:
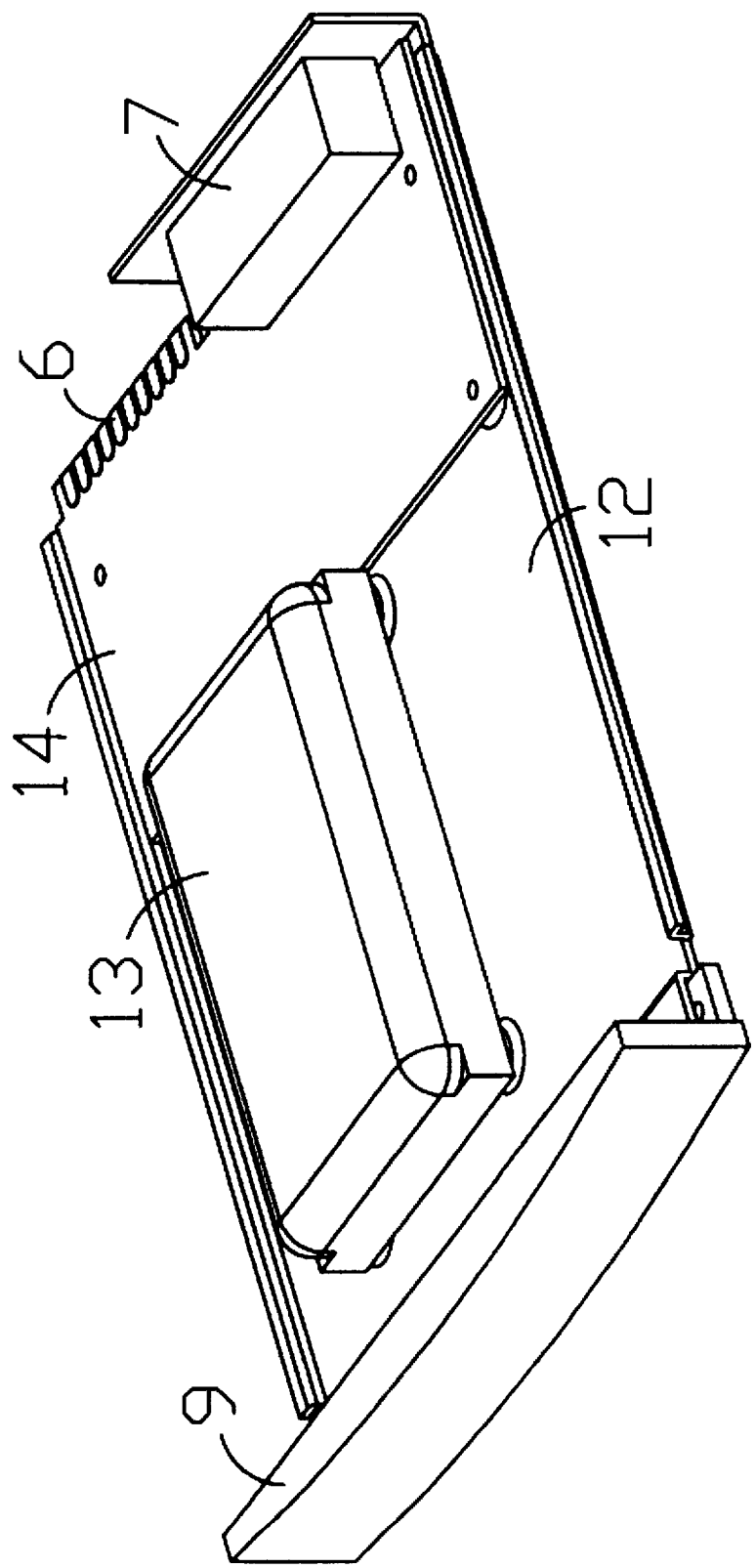
FIG. 7 shows an expansion card bracket supporting a small-format printed circuit board, a disk drive and a front bezel.

FIG. 5 illustrates a rear view which specifically shows the connector specifics of connector 7, as well as the assembled version of the CD-ROM expansion card of the present invention. FIG. 7 illustrates a slightly different version where the expansion card bracket 12 carries both a disk drive 13 and a small-format printed circuit board 14. This assembly meets the parameters of expansion card design under the present invention, having a bus connector 6 and a connector 7 co-located on the back-facing edge of the assembly. Thus, as is shown, there can exist a large variety of possible combinations for the expansion card of the present invention. Other structures can include floppy disk drives and other receptacles of removable computer media, such as memory card sockets, to be easily mounted to printed circuit board 3 and be made accessible through appropriate apertures in front bezel 9. This allows the combination of the entire storage subsystem, including the drive, the controller electronics, the means for interconnecting the controller to the drive, and all mounting hardware into one easily serviceable assembly.

The important feature of expansion card design under the present invention is the co-location of the bus connector 6 and connector 7 substantially on the same edge of the printed circuit board 3, the edge that faces towards the back of the enclosure when the expansion card is installed in the enclosure. This co-location of the two components enables the bus connector 6 to engage a socket 5 on the backplane 2 upon the installation of the expansion card in the enclosure, and simultaneously makes connector 7 accessible through a corresponding opening 4 in the enclosure back wall 1 for the purpose of attaching external cables. To meet cosmetic and emissions requirements, a metal back bezel 8 and a plastic front bezel 9 are further incorporated into the design of the expansion card. As required, the front bezel 9 may feature an additional EMI shield, many forms of which are known in the art. The indicator light 10 may be placed on the printed circuit board 3 so as to be visible through a corresponding aperture in front bezel 9, and so on.

Figure 8:
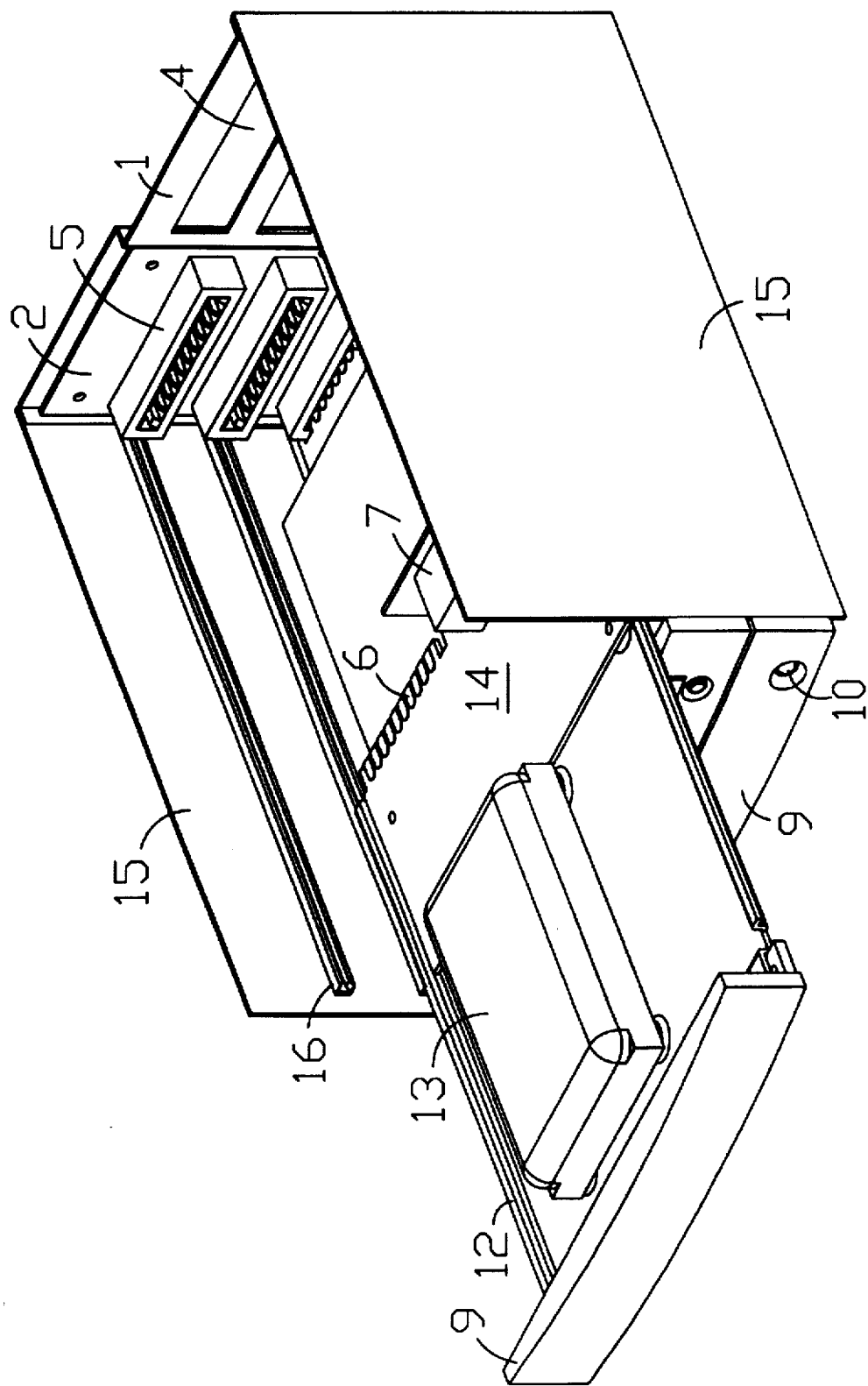
FIG. 8 is a perspective view of the enclosure of the present invention featuring the enclosure back wall and side walls.

The enclosure design is further illustrated in FIG. 8, having side walls 15 and incorporating a set of card guides 16 to slidingly receive expansion cards. A complete enclosure of the present invention will also incorporate a top wall and a bottom wall, which have been omitted from the illustration in FIG. 8 for clarity of presentation, as said top and bottom walls are not essential to the present invention but serve the purposes of providing mechanical stability, improving the cosmetic appearance and providing EMI shielding.

The structures used to assemble the structures shown in FIGS. 1–8 can be any method calculated to provide long life and serviceability. For example, in FIG. 1, the backplane 2 is attached to the back wall 1 by use of set off structures 17 to permit the use of screws or rivets to attach the backplane 2, yet not force the surface of backplane 2 against the back wall 1. Other types of attachment are equally acceptable both for the backplane 2 and all other structures.

The description presented herein is illustrative and not limiting. Other embodiments will become apparent to those skilled in the art in light of the teachings of the present invention. Such embodiments may include the incorporation of all or part of the apparatus of the present invention into improved versions of existing products, such as television sets and other appliances.

What is claimed is:

1. A computer expansion card comprising:
   a printed circuit board having a front edge and a back edge;
   a bus connector located along said back edge of said printed circuit board; and
   an electrical connector for attachment of external cables co-located with said bus connector along said back edge of said printed circuit board.

2. The computer expansion card of claim 1 wherein said bus connector is of a right-angle box type.

3. The computer expansion card of claim 1 wherein said bus connector is of card-edge type.

4. The computer expansion card of claim 1 further having a front bezel attached to said front edge of said printed circuit board.

5. The computer expansion card of claim 1 and further comprising a bracket engaging said printed circuit board for securing said printed circuit board to a computer chassis.

6. The computer expansion card of claim 1, and further comprising a disk drive capable of accepting removable disk media and supported by said printed circuit board.

7. The computer expansion card of claim 5, and further comprising a disk drive capable of receiving removable disk media and supported by said bracket.

* * * * *